United States Patent
Kurashina et al.

(10) Patent No.: US 11,024,520 B2
(45) Date of Patent: Jun. 1, 2021

(54) SUBSTRATE PROCESSING APPARATUS

(71) Applicant: EBARA CORPORATION, Tokyo (JP)

(72) Inventors: Keiichi Kurashina, Tokyo (JP); Toshio Yokoyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/588,178

(22) Filed: Sep. 30, 2019

(65) Prior Publication Data

US 2020/0027758 A1 Jan. 23, 2020

Related U.S. Application Data

(62) Division of application No. 15/076,265, filed on Mar. 21, 2016, now Pat. No. 10,468,274.

(30) Foreign Application Priority Data

Mar. 24, 2015 (JP) .................................. 2015-060284

(51) Int. Cl.
*H01L 21/67* (2006.01)
*H01L 21/677* (2006.01)
*H01L 21/687* (2006.01)

(52) U.S. Cl.
CPC .... *H01L 21/67057* (2013.01); *H01L 21/6708* (2013.01); *H01L 21/67086* (2013.01); *H01L 21/67751* (2013.01); *H01L 21/68707* (2013.01)

(58) Field of Classification Search
CPC ........... H01L 21/67057; H01L 21/6708; H01L 21/67086; B08B 3/10; B08B 3/045
See application file for complete search history.

(56) References Cited

U.S. PATENT DOCUMENTS 9,046,789 B2 6/2015 Lin et al.
2006/0118140 A1* 6/2006 Nishimura ................ B08B 3/10
134/34

(Continued)

FOREIGN PATENT DOCUMENTS

JP 60-131995 A 7/1985
JP 60-262991 A 12/1985

(Continued)

OTHER PUBLICATIONS

Machine translation of JPH0661209A, dated Mar. 1994. (Year: 1994).*

(Continued)

*Primary Examiner* — Kevin G Lee
(74) *Attorney, Agent, or Firm* — BakerHostetler

(57) ABSTRACT

The substrate processing apparatus includes a processing chamber including an outer chamber configured to hold a processing liquid and an inner chamber capable of surrounding the substrate held by the substrate holder; a liquid delivery pipe having one end coupled to a bottom of the inner chamber and other end coupled to the outer chamber; a pump configured to suck the processing liquid from the inner chamber through the liquid delivery pipe and to deliver the processing liquid to the outer chamber through the liquid delivery pipe; and a guide cover having a through-hole in which the substrate holder can be inserted. The guide cover is located below an upper end of the outer chamber and above the inner chamber.

3 Claims, 16 Drawing Sheets

(56) References Cited

U.S. PATENT DOCUMENTS

| | | | |
|---|---|---|---|
| 2006/0234508 A1 | 10/2006 | Shirakashi et al. | |
| 2007/0272657 A1 | 11/2007 | Hansen et al. | |
| 2013/0167876 A1 | 7/2013 | Taeaki et al. | |
| 2013/0196572 A1* | 8/2013 | Ko | H01L 21/67751 451/11 |
| 2015/0013905 A1 | 1/2015 | Nakagawa et al. | |
| 2015/0068890 A1 | 3/2015 | Yoshioka et al. | |
| 2016/0305032 A1 | 10/2016 | Yamamoto et al. | |

FOREIGN PATENT DOCUMENTS

| | | | |
|---|---|---|---|
| JP | H02-090591 A | 3/1990 | |
| JP | H05-095076 U | 12/1993 | |
| JP | H06-061209 A | 3/1994 | |
| JP | 2004-339590 A | 12/2004 | |
| JP | 2006-152415 A | 6/2006 | |
| JP | 2008-095160 A | 4/2008 | |
| JP | 2010-070779 A | 4/2010 | |
| JP | 2012-046770 A | 3/2012 | |
| JP | 2014-224300 A | 12/2014 | |

OTHER PUBLICATIONS

Machine translation of JP60-131995 A, dated Jul. 1985 (Year: 1985).

* cited by examiner

SUBSTRATE PROCESSING APPARATUS

CROSS REFERENCE TO RELATED APPLICATION

This document claims priority to U.S. Non-Provisional patent application Ser. No. 15/076,265, filed Mar. 21, 2016 and to Japanese Patent Application Number 2015-060284 filed Mar. 24, 2015, the entire contents of which are hereby incorporated by reference.

BACKGROUND

FIG. 17 is a view showing a conventional substrate processing apparatus. As shown in FIG. 17, the substrate processing apparatus includes a substrate holder 101 for holding a substrate W, and a processing chamber 102 for holding a processing liquid therein. The processing chamber 102 includes an inner chamber 103 in which the substrate W, held by the substrate holder 101, is disposed, and an outer chamber 104 surrounding the inner chamber 103. The outer chamber 104 is coupled to the inner chamber 103 through a liquid delivery pipe 105. One end of the liquid delivery pipe 105 is coupled to a bottom of the outer chamber 104, and other end of the liquid delivery pipe 105 is coupled to a bottom of the inner chamber 103. A pump P is coupled to the liquid delivery pipe 105.

When the pump P is operated, the processing liquid is sucked from the bottom of the outer chamber 104 through the liquid delivery pipe 105, and is supplied through the liquid delivery pipe 105 into the inner chamber 103. The processing liquid ascends in the inner chamber 103 to form an ascending flow, and overflows a side wall of the inner chamber 103 into the outer chamber 104. Further, the processing liquid is returned to the inner chamber 103 through the liquid delivery pipe 105 with the operation of the pump P. In this manner, the processing liquid circulates between the inner chamber 103 and the outer chamber 104 while forming the ascending flow in the inner chamber 103.

In order to increase a processing rate (which is also referred to as a processing speed) of the substrate W, it is necessary to increase a flow velocity of the processing liquid (i.e., a flow velocity of the processing liquid ascending in the inner chamber 103) which is in contact with a surface of the substrate W. However, when the flow velocity of the processing liquid in the inner chamber 103 is increased, the processing liquid may spout from the inner chamber 103 as shown in FIG. 17, or the substrate holder 101 may be floated up by the ascending flow of the processing liquid. Therefore, it is difficult to increase the flow velocity of the processing liquid in the inner chamber 103.

On the other hand, when the processing liquid flows in the inner chamber 103 at a low flow velocity, the processing liquid forms a laminar flow in the inner chamber 103. If the substrate W is immersed in the laminar flow of the processing liquid, the substrate W may be locally processed, and may be non-uniformly processed.

SUMMARY OF THE INVENTION

There is provided a substrate processing apparatus capable of uniformly processing a substrate with an increased processing rate of the substrate.

Embodiments, which will be described below, relate to a substrate processing apparatus for processing a substrate, such as a wafer, and more particularly to a substrate processing apparatus for processing the substrate by immersing the substrate in a processing liquid.

In an embodiment, there is provided a substrate processing apparatus comprising: a substrate holder for holding a substrate; a processing chamber including an outer chamber configured to hold a processing liquid for processing the substrate, and an inner chamber housed in the outer chamber and capable of surrounding the substrate held by the substrate holder; a liquid delivery pipe having one end coupled to a bottom of the inner chamber and other end coupled to the outer chamber; a pump coupled to the liquid delivery pipe and configured to suck the processing liquid from the inner chamber through the liquid delivery pipe and to deliver the processing liquid to the outer chamber through the liquid delivery pipe; and a guide cover having a through-hole in which the substrate holder can be inserted, the guide cover being located below an upper end of the outer chamber and above the inner chamber.

In an embodiment, the substrate holder has a flange which closes the through-hole.

In an embodiment, there is provided a substrate processing apparatus comprising: a substrate holder for holding a substrate; a processing chamber configured to hold a processing liquid for processing the substrate, the substrate holder being disposed in the processing chamber; processing-liquid nozzles disposed in the processing chamber and oriented to the substrate held by the substrate holder; a liquid delivery pipe having one end coupled to a bottom of the processing chamber and other end coupled to the processing-liquid nozzles; and a pump coupled to the liquid delivery pipe and configured to suck the processing liquid from a bottom of the processing chamber through the liquid delivery pipe and to deliver the processing liquid to the processing-liquid nozzles through the liquid delivery pipe.

In an embodiment, the substrate processing apparatus further comprises a nozzle swing device configured to swing the processing-liquid nozzles.

In an embodiment, the substrate processing apparatus further comprises a holder oscillation device configured to cause the substrate holder to reciprocate vertically.

In an embodiment, there is provided a substrate processing apparatus comprising: a substrate holder for holding a substrate; a processing chamber configured to hold a processing liquid for processing the substrate, the substrate holder being disposed in the processing chamber; a liquid delivery pipe having one end coupled to a bottom of the processing chamber and other end communicating with an interior of the processing chamber; a pump coupled to the liquid delivery pipe and configured to suck the processing liquid from the bottom of the processing chamber through the liquid delivery pipe and to return the processing liquid into the processing chamber through the liquid delivery pipe; and baffle plates disposed in the inner chamber and arranged adjacent to the substrate held by the substrate holder.

In an embodiment, the substrate processing apparatus further comprises a holder oscillation device configured to cause the substrate holder to oscillate vertically.

In an embodiment, the substrate processing apparatus further comprises a baffle-plate swing device configured to swing the baffle plates.

In an embodiment, there is provided a substrate processing apparatus comprising: a substrate holder for holding a substrate; a processing chamber configured to hold a processing liquid for processing the substrate, the substrate holder being disposed in the processing chamber; a liquid delivery pipe having one end coupled to a bottom of the processing chamber and other end communicating with an interior of the processing chamber; a pump coupled to the liquid delivery pipe and configured to suck the processing liquid from a bottom of the processing chamber through the liquid delivery pipe and to return the processing liquid into the processing chamber through the liquid delivery pipe; and a holder oscillation device configured to cause the substrate holder to oscillate vertically, the substrate holder having at least one paddle for agitating the processing liquid.

In an embodiment, the at least one paddle comprises paddles arranged at both sides of the substrate held by the substrate holder.

In an embodiment, the at least one paddle comprises paddles extending across the substrate held by the substrate holder horizontally.

In an embodiment, there is provided a substrate processing apparatus comprising: a substrate holder for holding a substrate; a processing chamber configured to hold a processing liquid for processing the substrate, the substrate holder being disposed in the processing chamber; a liquid delivery pipe having one end coupled to a bottom of the processing chamber and other end communicating with an interior of the processing chamber; a pump coupled to the liquid delivery pipe and configured to suck the processing liquid from the bottom of the processing chamber through the liquid delivery pipe and to return the processing liquid into the processing chamber through the liquid delivery pipe; and inert-gas supply nozzles disposed in the processing chamber and oriented to the substrate held by the substrate holder.

In an embodiment, there is provided a substrate processing apparatus comprising: a substrate holder for holding a substrate; a processing chamber configured to hold a processing liquid for processing the substrate, the substrate holder being disposed in the processing chamber; a porous member secured to an upper portion of the processing chamber; a liquid delivery pipe having one end coupled to a bottom of the processing chamber and other end located above the porous member; and a pump coupled to the liquid delivery pipe and configured to suck the processing liquid from the bottom of the processing chamber through the liquid delivery pipe and to supply the processing liquid onto the porous member through the liquid delivery pipe.

In an embodiment, there is provided a substrate processing apparatus comprising: a substrate holder for holding a substrate; a processing chamber configured to hold a processing liquid for processing the substrate, the substrate holder being disposed in the processing chamber; a liquid delivery pipe having one end coupled to a bottom of the processing chamber and other end communicating with an interior of the processing chamber; a pump coupled to the liquid delivery pipe and configured to suck the processing liquid from the bottom of the processing chamber through the liquid delivery pipe and to return the processing liquid into the processing chamber through the liquid delivery pipe; and an elastic membrane incorporated in a side wall of the processing chamber, the elastic membrane facing a surface of the substrate held by the substrate holder.

In an embodiment, the elastic membrane constitutes at least a part of a fluid chamber which can receive a fluid therein.

According to the above-described embodiments, a descending flow of the processing liquid is formed in the inner chamber. Therefore, the processing liquid does not spout from the inner chamber, and/or the substrate holder is not floated when a flow velocity of the processing liquid is increased. Moreover, the processing liquid flowing at a high flow velocity form's a turbulent flow in the processing chamber, and uniformly touches the entirety of the substrate. Therefore, the entirety of the substrate can be uniformly processed. In particular, the guide cover disposed in the processing liquid can not only smoothly guide the processing liquid, ascending in the outer chamber, into the inner chamber, but can also prevent a suction vortex in a surface of the processing liquid. As a result, the flow velocity of the processing liquid can be further increased.

Elements including the processing-liquid nozzle, the baffle plates, the paddle, the inert-gas supply nozzle, and the porous member, have a function to agitate the processing liquid in the processing chamber. Therefore, the processing liquid can uniformly process the entirety of the substrate.

When the processing liquid in the processing chamber is sucked by the operation of the pump, a pressure of the processing liquid in the processing chamber is lowered. The elastic membrane deforms toward the surface of the substrate, thereby reducing a cross section of the processing chamber. Therefore, the flow velocity of the processing liquid descending in the processing chamber is increased, and the processing liquid is brought into contact with the substrate while forming a turbulent flow. As a result, the processing liquid can uniformly process the entirety of the substrate.

DESCRIPTION OF EMBODIMENTS

Figure 1:
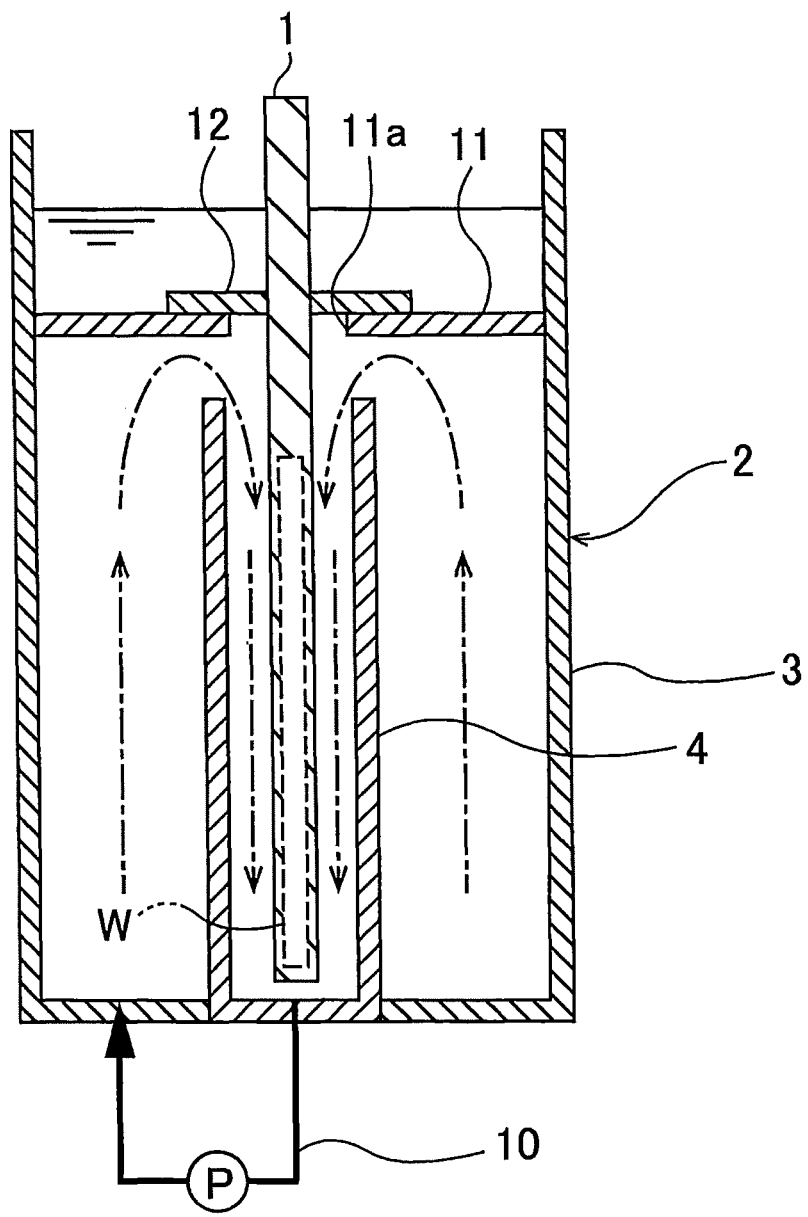
FIG. 1 is a view showing an etching apparatus according to an embodiment.

Embodiments will be described below with reference to the drawings. In FIGS. 1 through 16, identical or corresponding elements will be denoted by the same reference numerals, and repetitive descriptions thereof are omitted.

An etching apparatus, which will be described below, is an example of a substrate processing apparatus for processing a substrate, such as a wafer. Other examples of the substrate processing apparatus include an electroplating apparatus, an electroless plating apparatus, and an electrolytic etching apparatus. The etching apparatus, which is one embodiment of the substrate processing apparatus, will be described below.

FIG. 1 is a view showing the etching apparatus according to an embodiment. As shown in FIG. 1, the etching apparatus includes a substrate holder 1 for holding a substrate W, such as a wafer, and an etching chamber (or a processing chamber) 2 for holding an etching liquid (or a processing liquid) therein for removing a resist formed on a surface of the substrate W. The etching chamber 2 includes an outer chamber 3 for holding the etching liquid therein, and an inner chamber 4 surrounding the substrate W held by the substrate holder 1. The inner chamber 4 is housed in the outer chamber 3. The substrate holder 1 and the etching chamber 2 (i.e., the outer chamber 3 and the inner chamber 4) may be formed by resin material, such as PVC (polyvinyl chloride) or PTFE (polytetrafluoroethylene). Alternatively, the substrate holder 1 and the etching chamber 2 may be formed by metal, such as Ti (titanium) or SUS (stainless steel), covered with resin material, such as PTFE (polytetrafluoroethylene).

The inner chamber 4 is coupled to the outer chamber 3 through a liquid delivery pipe 10. More specifically, one end of the liquid delivery pipe 10 is coupled to a bottom of the inner chamber 4, and other end of the liquid delivery pipe 10 is coupled to a bottom of the outer chamber 3. A pump P is coupled to the liquid delivery pipe 10. When the pump P is operated, the etching liquid is sucked from the bottom of the inner chamber 4 through the liquid delivery pipe 10, and is delivered through the liquid delivery pipe 10 into the outer chamber 3. The etching liquid form a descending flow in the inner chamber 4 while forming an ascending flow in the outer chamber 3.

The inner chamber 4 is completely submerged in the etching liquid contained in the outer chamber 3. In other words, an upper end of the outer chamber 3 and a surface of the etching liquid in the outer chamber 3 are located above an upper end of the inner chamber 4. If the surface of the etching liquid in the inner chamber 4 is located below the upper end of the inner chamber 4, the etching liquid in the outer chamber 3 overflows the upper end of the inner chamber 4 into the inner chamber 4. At this time, the etching liquid involves an air, and relatively-large air bubbles are created unevenly in the etching liquid in the inner chamber 4. Such air bubbles may prevent a uniform etching action of the etching liquid.

The etching apparatus further includes a guide cover 11 for changing a direction of the ascending flow formed in the outer chamber 3. This guide cover 11 is secured to an inner surface of the outer chamber 3. More specifically, the guide cover 11 is located below the upper end of the outer chamber 3 and below the surface of the etching liquid held in the outer chamber 3, and above the inner chamber 4. A through-hole 11a is formed in the guide cover 11 so that the substrate holder 1 can be inserted through the through-hole 11a into the inner chamber 4.

The ascending flow formed in the outer chamber 3 impinges on a lower surface of the guide cover 11, thereby changing its moving direction. The etching liquid flows through a gap between the guide cover 11 and the inner chamber 4 into the inner chamber 4 to form the descending flow in the inner chamber 4. The etching liquid in the inner chamber 4 descends along the surface of the substrate W while touching the surface of the substrate W held by the substrate holder 1, thereby removing a resist formed on the substrate W. The etching liquid is sucked into the liquid delivery pipe 10 coupled to the bottom of the inner chamber 4, and is delivered into the outer chamber 3 through the liquid delivery pipe 10 to form the ascending flow in the outer chamber 3. In this manner, the etching liquid circulates between the inner chamber 4 and the outer chamber 3 while forming the descending flow and the ascending flow in the inner chamber 4 and the outer chamber 3, respectively. The inner chamber 4 has a cross section which is smaller than a cross section of the outer chamber 3. Therefore, the flow velocity of the descending flow of the etching liquid in the inner chamber 4 is higher than the flow velocity of the ascending flow of the etching liquid in the outer chamber 3.

Since the descending flow of the etching liquid is formed in the inner chamber 4 and the ascending flow in the outer chamber 3 impinges on the guide cover 11, the etching liquid in the outer chamber 3 does not spout out even if the flow velocity of the etching liquid is increased. Further, since the substrate holder 1 in the inner chamber 4 is in contact with the descending flow of the etching liquid, the substrate holder 1, which holds the substrate W, is not floated.

Without the guide cover 11, the liquid surface lying above the inner chamber 4 may sag when the flow velocity of the etching liquid is increased, thus locally forming a suction vortex, even if the surface of the etching liquid in the outer chamber 3 is higher than the upper end of the inner chamber 4. If the suction vortex reaches the surface of the substrate W, the suction vortex may prevent the uniform etching action of the etching liquid. Thus, the guide cover 11 is provided, so that the etching liquid ascending in the outer chamber 3 impinges on the guide cover 11 to flow into the inner chamber 4. Therefore, the generation of the suction vortex is prevented.

The substrate holder 1 has a flange 12 at its upper portion. The flange 12 is configured to close the through-hole 11a when the substrate holder 1 is inserted through the through-hole 11a of the guide cover 11 into the inner chamber 4. The substrate holder 1 having the flange 12 will be described below with reference to FIG. 2 and FIG. 3.

Figure 2:
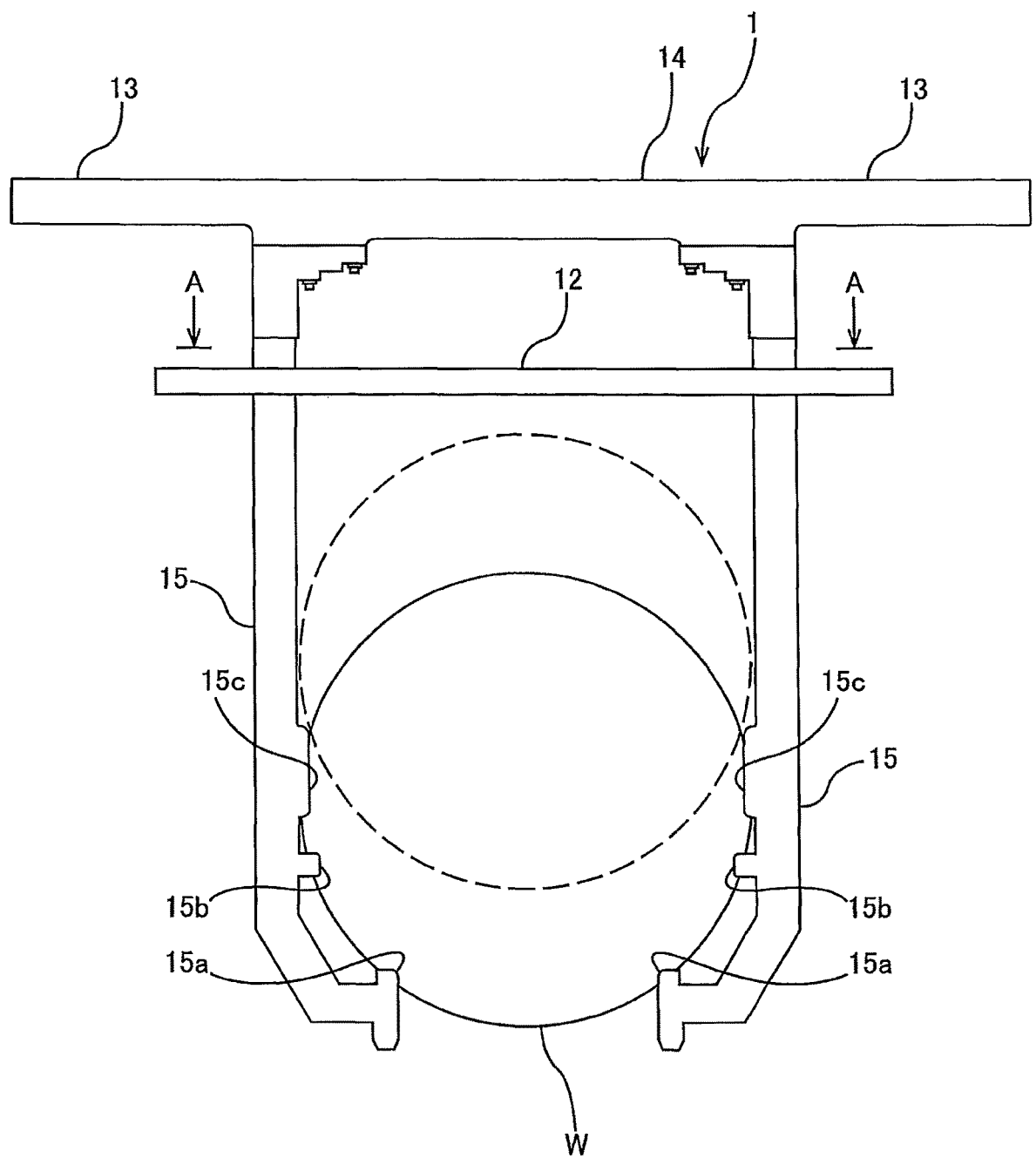
FIG. 2 is a view showing a substrate holder.
Figure 3:
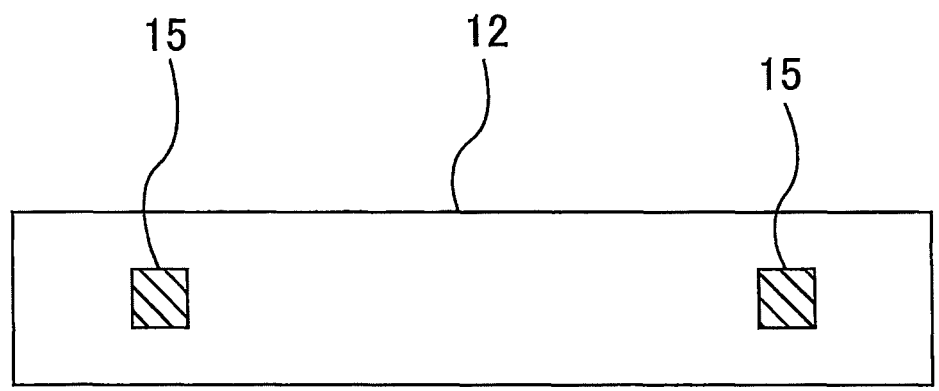
FIG. 3 is a cross-sectional view taken along line A-A in FIG. 2.

FIG. 2 is a view showing the substrate holder 1, and FIG. 3 is a cross-sectional view taken along line A-A in FIG. 2. The substrate holder 1 has outwardly-projecting portions 13, 13. A support arm 14 extends between the projecting portions 13, 13. A transporter (not shown) is configured to transport the substrate holder 1 while holding the support arm 14. Two holding arms 15, 15 for holding the substrate W are secured to the support arm 14. Each holding arm 15 has a first slit 15a, a second slit 15b, and a third slit 15c.

Figure 4:
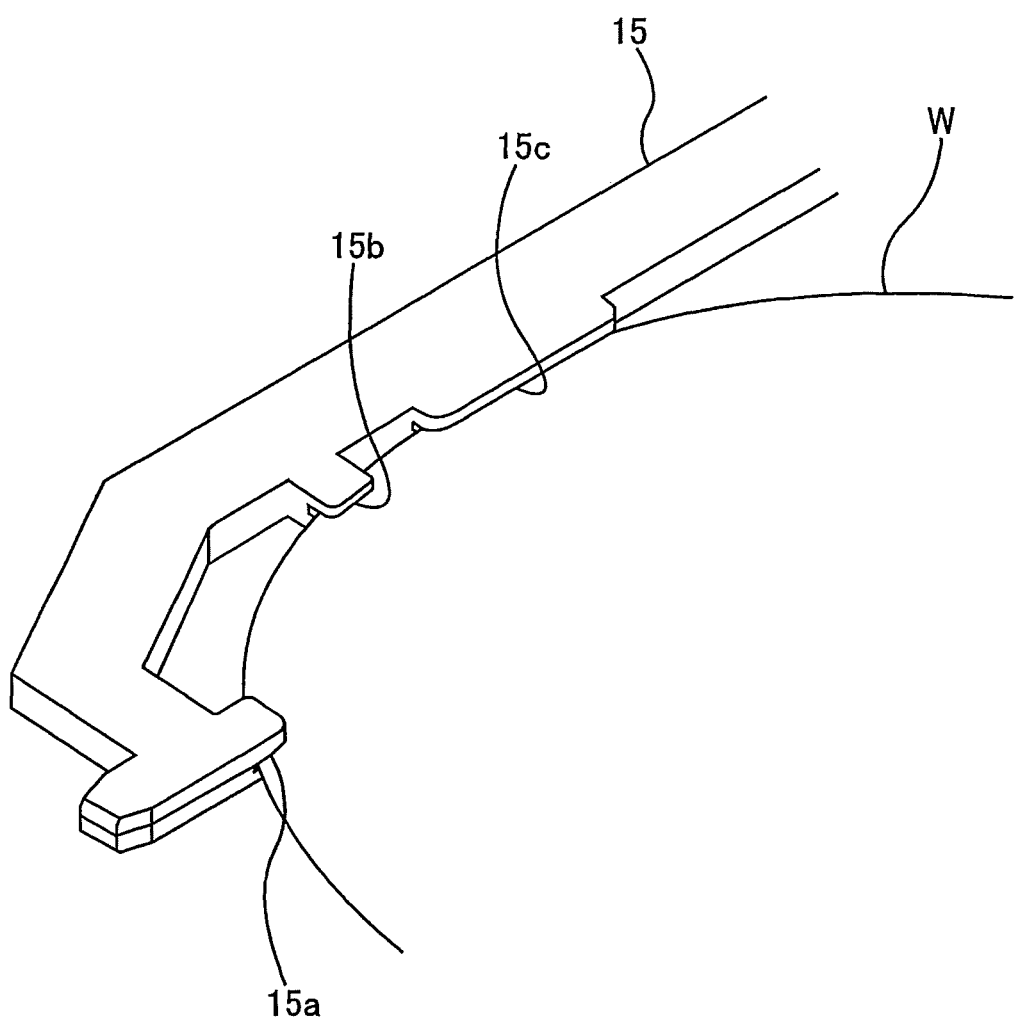
FIG. 4 is a view showing a substrate which is held in slits of each holding arm.

FIG. 4 is a view showing the substrate W held in the slits 15a to 15c of the holding arm 15. One of the holding arms 15 is shown in FIG. 4. As shown in FIG. 4, the substrate W is held by the substrate holder 1 with a periphery of the substrate W inserted into the slits 15a to 15c. As shown in FIG. 2, the substrate W is slid from a position shown by a dotted line to a position shown by a solid line, so that the periphery of the substrate W is inserted into the slits 15a to 15c of the two holding arms 15, 15.

The flange 12 is secured to the two holding arms 15, 15. As shown in FIG. 1, the substrate holder 1, when holding the substrate W, is inserted through the through-hole 11a into the inner chamber 4, until the flange 12 is brought into contact with the guide cover 11. The flange 12 is a lid or cap having a horizontal lower surface. A size of the flange 12 is larger than a size of the through-hole 11a of the guide cover 11. Therefore, when the flange 12 is brought into contact with the guide cover 11, the flange 12 closes the through-hole 11a.

The guide cover 11 and the flange 12 on the guide cover 11 are located below the surface of the etching liquid. As can be seen from FIG. 1, since the flange 12 closes the through-hole 11a, the generation of the suction vortex in the etching chamber 2 can be completely prevented. Further, since the descending flow of the etching liquid is formed in the inner chamber 4 during etching of the substrate W, the flange 12 is pressed against the guide cover 11, thereby stabilizing an attitude of the substrate holder 1 during etching of the substrate W.

Figure 5A:
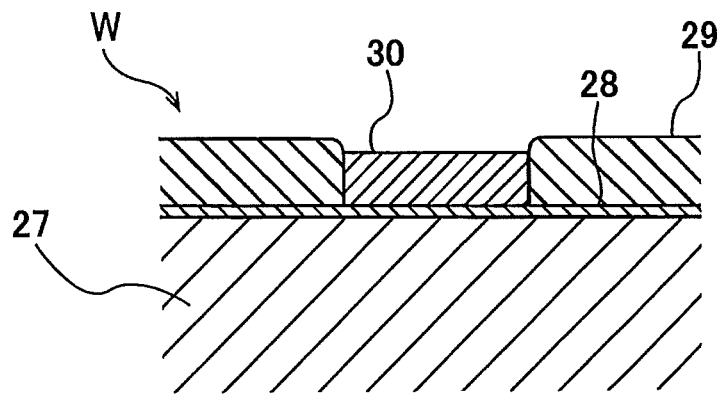
FIGS. 5A, 5B, 5C are schematic views each showing a section of a surface of the substrate.
Figure 5B:
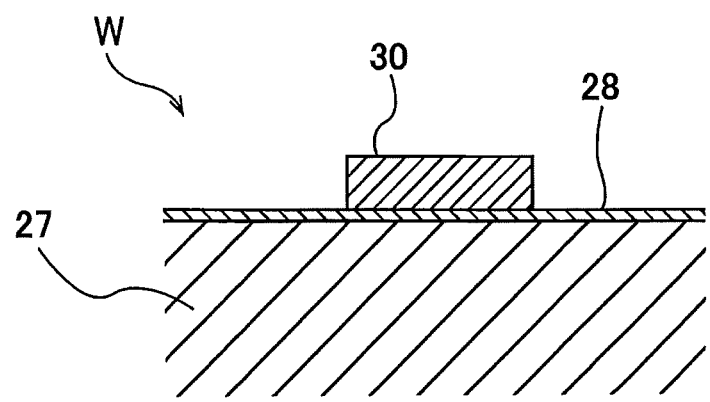
Figure 5C:
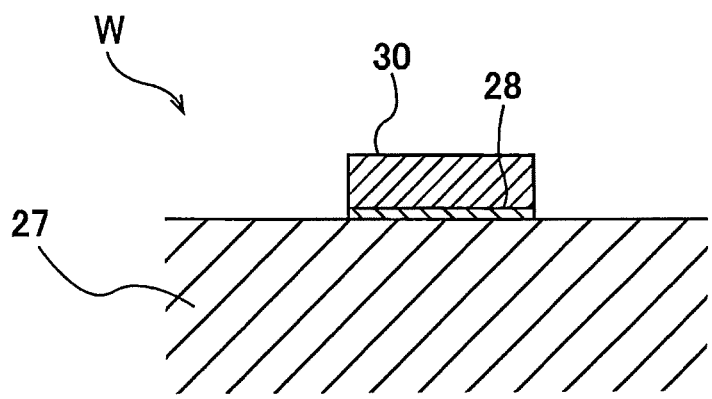

FIGS. 5A to 5C are schematic views showing a section of the surface of the substrate W. As shown in FIG. 5A, a conductive layer 28, such as a seed layer, is formed on a surface of a dielectric layer 27. Further, a resist 29 is formed on the conductive layer 28. A metal 30 is deposited in an opening of the resist 29. When the substrate W is immersed in the etching liquid in the etching chamber 2, the resist 29 is removed and the conductive layer 28 is exposed, as shown in FIG. 5B. Thereafter, the substrate W is cleaned with a cleaning liquid. The cleaned substrate W is then immersed in another etching liquid, until the exposed conductive layer 28 is removed, as shown in FIG. 5C.

The etching liquid, descending in the inner chamber 4 at a high flow velocity, is brought into contact with the substrate W while forming a turbulent flow in the inner chamber 4. The etching liquid in a state of the turbulent flow can uniformly touch the entirety of the resist 29. Therefore, the etching liquid can uniformly remove the resist 29 at a high removal rate while preventing a local removal of the resist 29. In other words, the etching liquid can uniformly process the substrate W at a high processing rate.

Figure 6:
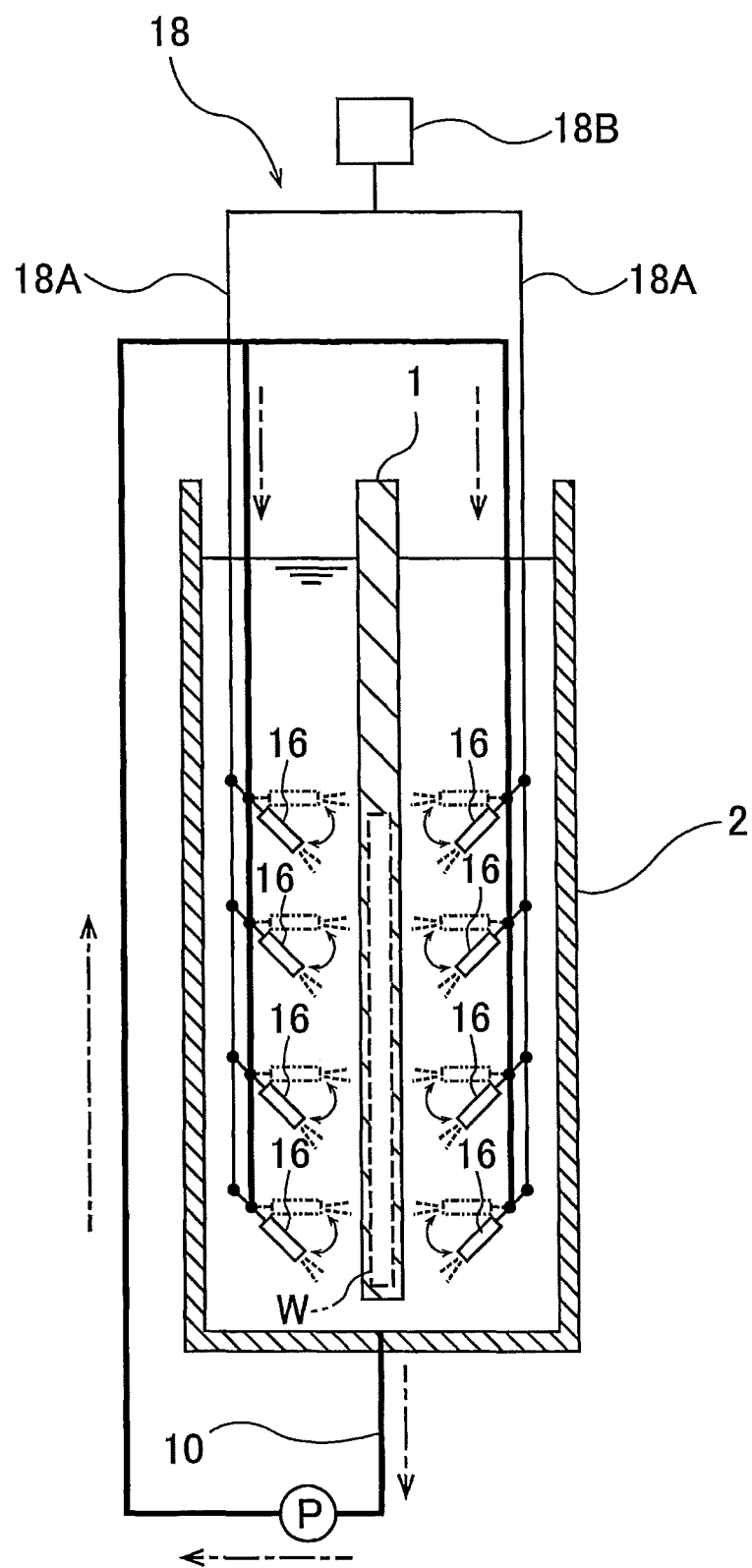
FIG. 6 is a view showing the etching apparatus according to another embodiment.

FIG. 6 is a view showing the etching apparatus according to another embodiment. In this embodiment shown in FIG. 6, the etching chamber 2 is not divided into the outer chamber 3 and the inner chamber 4. However, the etching chamber 2 may include the outer chamber 3 and the inner chamber 4 as with the embodiment shown in FIG. 1. The etching apparatus shown in FIG. 6 includes a plurality of etching-liquid nozzles (which may be referred to as processing-liquid nozzles) 16 disposed in the etching chamber 2. The etching apparatus further includes the liquid delivery pipe 10 and the pump P coupled to the liquid delivery pipe 10. One end of the liquid delivery pipe 10 is coupled to the bottom of the etching chamber 2, and other end of the liquid delivery pipe 10 is coupled to the etching-liquid nozzles 16. The etching-liquid nozzles 16 are oriented to the substrate W held by the substrate holder 1. As shown in FIG. 6, the etching-liquid nozzles 16 may be oriented obliquely downwardly.

The pump P sucks the etching liquid from the bottom of the etching chamber 2 through the liquid delivery pipe 10, and delivers the etching liquid to the etching-liquid nozzles 16 through the liquid delivery pipe 10. As with the above-described embodiment, when the pump P is operated, the descending flow of the etching liquid is formed in the etching chamber 2. Therefore, floating of the substrate holder 1 disposed in the etching chamber 2 is prevented.

The etching-liquid nozzles 16 are arranged at both sides of the substrate W held by the substrate holder 1, and are adjacent to the substrate W. In this embodiment, eight etching-liquid nozzles 16 are provided. However, the number of etching-liquid nozzles 16 is not limited to this embodiment. The etching-liquid nozzles 16 are coupled to a nozzle swing device 18, which is configured to swing the etching-liquid nozzles 16. The nozzle swing device 18 includes linkages 18A and an actuator 18B.

When the pump P is operated, the etching liquid is sucked into the liquid delivery pipe 10 while forming the descending flow in the etching chamber 2. Further, the etching liquid is delivered through the liquid delivery pipe 10 to each of the etching-liquid nozzles 16, and is ejected from the etching-liquid nozzles 16 toward the substrate W. The jet of the etching liquid agitates the etching liquid which is in contact with the substrate W. Therefore, the etching liquid can uniformly touch the entirety of the resist. During processing, the nozzle swing device 18 may swing the etching-liquid nozzles 16. The swinging motions of the etching-liquid nozzles 16 can more effectively agitate the etching liquid that is in contact with the substrate W.

Figure 7:
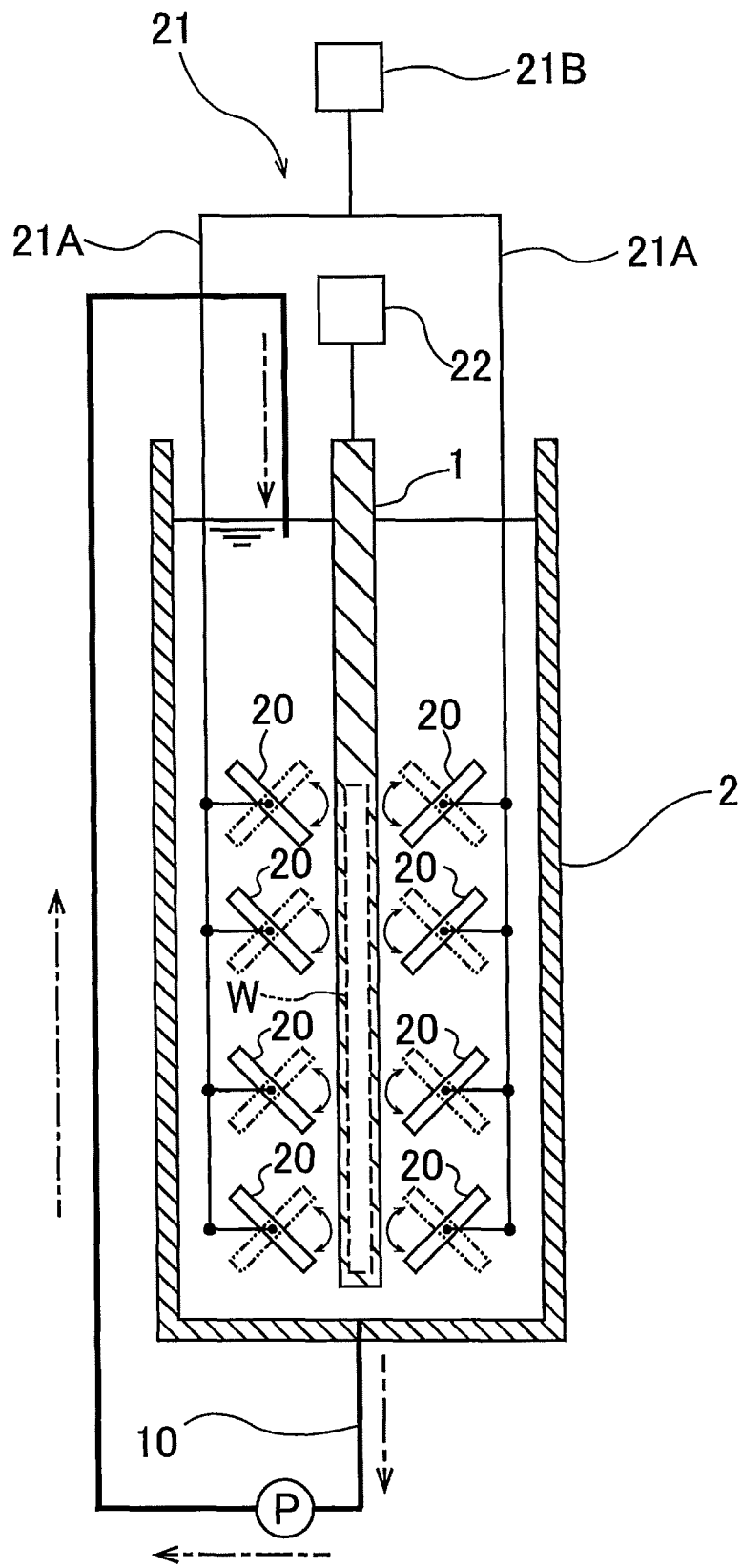
FIG. 7 is a view showing the etching apparatus according to still another embodiment.

FIG. 7 is a view showing the etching apparatus according to still another embodiment. Structures of this embodiment, which are the same as those of the embodiment shown in FIG. 6, will not be described particularly, and their duplicate descriptions are omitted. As shown in FIG. 7, one end (or an inlet) of the liquid delivery pipe 10 is coupled to the bottom of the etching chamber 2, and other end (or an outlet) of the liquid delivery pipe 10 is in a communication with an interior of the etching chamber 2. The other end (i.e., the outlet) of the liquid delivery pipe 10 is located slightly below the surface of the etching liquid in the etching chamber 2, and is located above the substrate W in the etching chamber 2. The pump P is coupled to the liquid delivery pipe 10, and is configured to suck the etching liquid from the bottom of the etching chamber 2 through the liquid delivery pipe 10 and to return the etching liquid into the etching chamber 2 through the liquid delivery pipe 10.

A plurality of baffle plates 20 for agitating the etching liquid are disposed in the etching chamber 2. These baffle plates 20 are arranged at both sides of the substrate W held by the substrate holder 1, and are adjacent to both surfaces of the substrate W. In this embodiment, eight baffle plates 20 are provided. However, the number of baffle plates 20 is not limited to this embodiment. The etching liquid descending in the etching chamber 2 is brought into contact with the substrate W while forming the turbulent flow upon impinging on the baffle plates 20. The etching liquid in a state of the turbulent flow prevents the local removal of the resist. Therefore, the resist can be uniformly removed at the high removal rate.

The baffle plates 20 are coupled to a baffle-plate swing device 21, which is configured to swing the baffle plates 20. The baffle-plate swing device 21 includes linkages 21A and an actuator 21B. The swinging motions of the baffle plates 20 can more effectively agitate the etching liquid that is in contact with the substrate W.

The etching apparatus of this embodiment further includes a holder oscillation device 22 configured to cause the substrate holder 1 to oscillate vertically while the substrate W, held by the substrate holder 1, is immersed in the etching liquid. The holder oscillation device 22 is disposed above the etching chamber 2, and is coupled to the upper portion of the substrate holder 1. When the substrate holder 1 is forced to oscillate in the vertical directions, the etching liquid in a state of the turbulent flow can uniformly touch the entirety of the substrate W.

Figure 8:
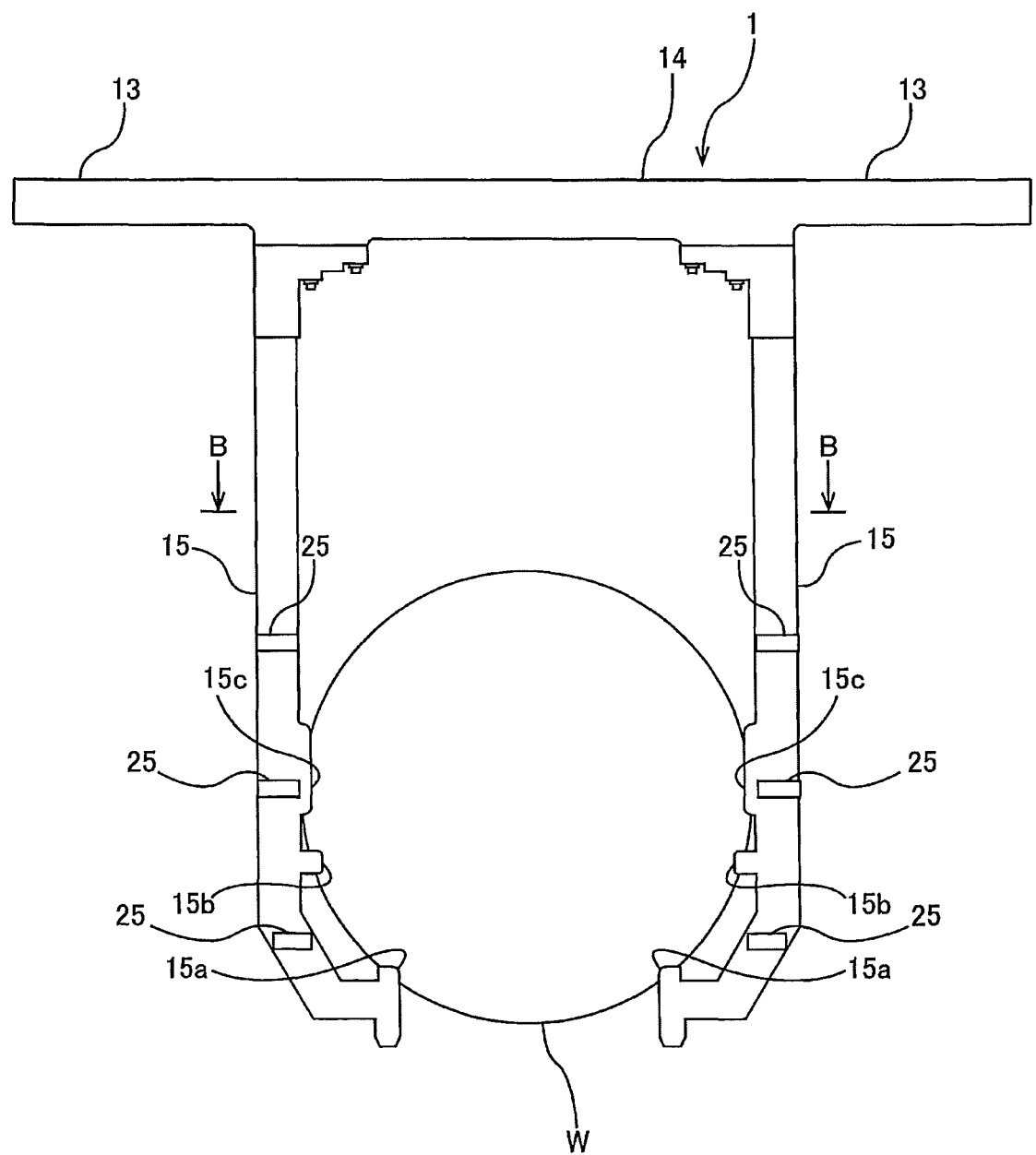
FIG. 8 is a view showing a modified example of the substrate holder.
Figure 9:
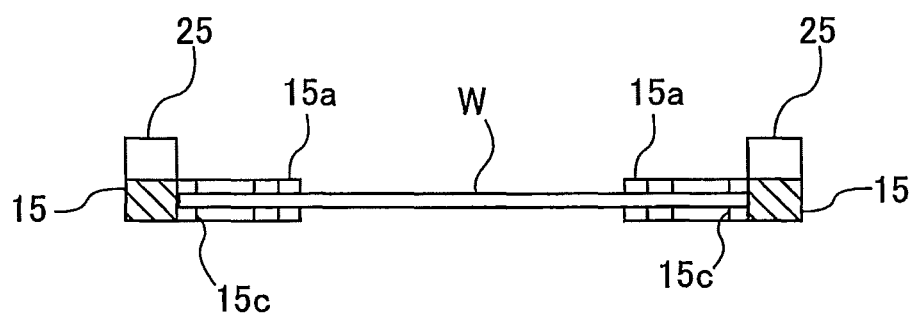
FIG. 9 is a cross-sectional view taken along line B-B of FIG. 8.

FIG. 8 is a view showing a modified example of the substrate holder 1. FIG. 9 is a cross-sectional view taken along line B-B of FIG. 8. As shown in FIG. 8 and FIG. 9, the substrate holder 1 may have a plurality of paddles 25 for agitating the etching liquid in the etching chamber 2. Each paddle 25 comprises a horizontal plate. The paddles 25 are secured to the holding arms 15, and are arranged at both sides of the substrate W held by the substrate holder 1. In FIG. 8, the substrate holder 1 has six paddles 25. However, the number of paddles 25 is not limited to this embodiment. When the substrate holder 1 oscillates upward and downward by the holder oscillation device 22, each of the paddles 25 can agitate the etching liquid.

Figure 10:
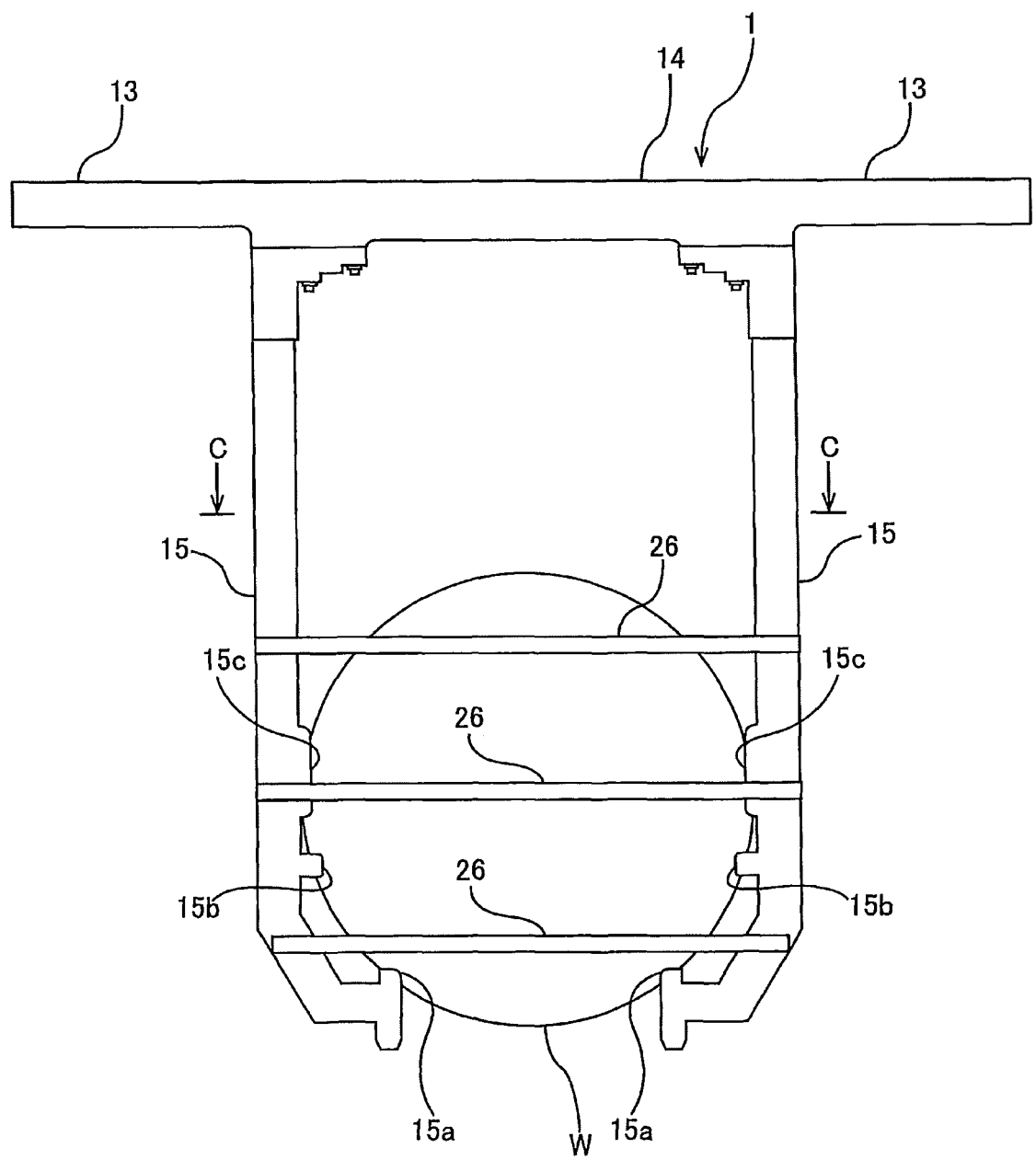
FIG. 10 is a view showing another modified example of the substrate holder.
Figure 11:
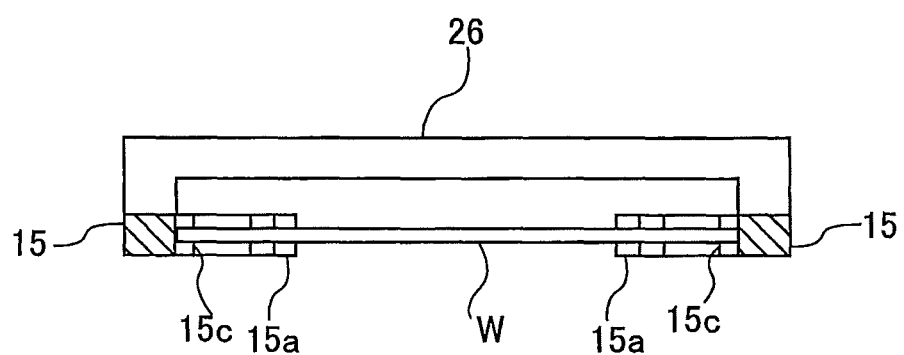
FIG. 11 is a cross-sectional view taken along line C-C of FIG. 10.

FIG. 10 is a view showing another modified example of the substrate holder 1. FIG. 11 is a cross-sectional view taken along line C-C of FIG. 10. As shown in FIG. 10 and FIG. 11, a plurality of paddles 26, extending between the holding arms 15, 15, may be provided. The paddles 26 shown in FIG. 10 and FIG. 11 extend horizontally across the substrate W held by the substrate holder 1. In FIG. 10, the substrate holder 1 has three paddles 26. However, the number of paddles 26 is not limited to this embodiment.

Figure 12:
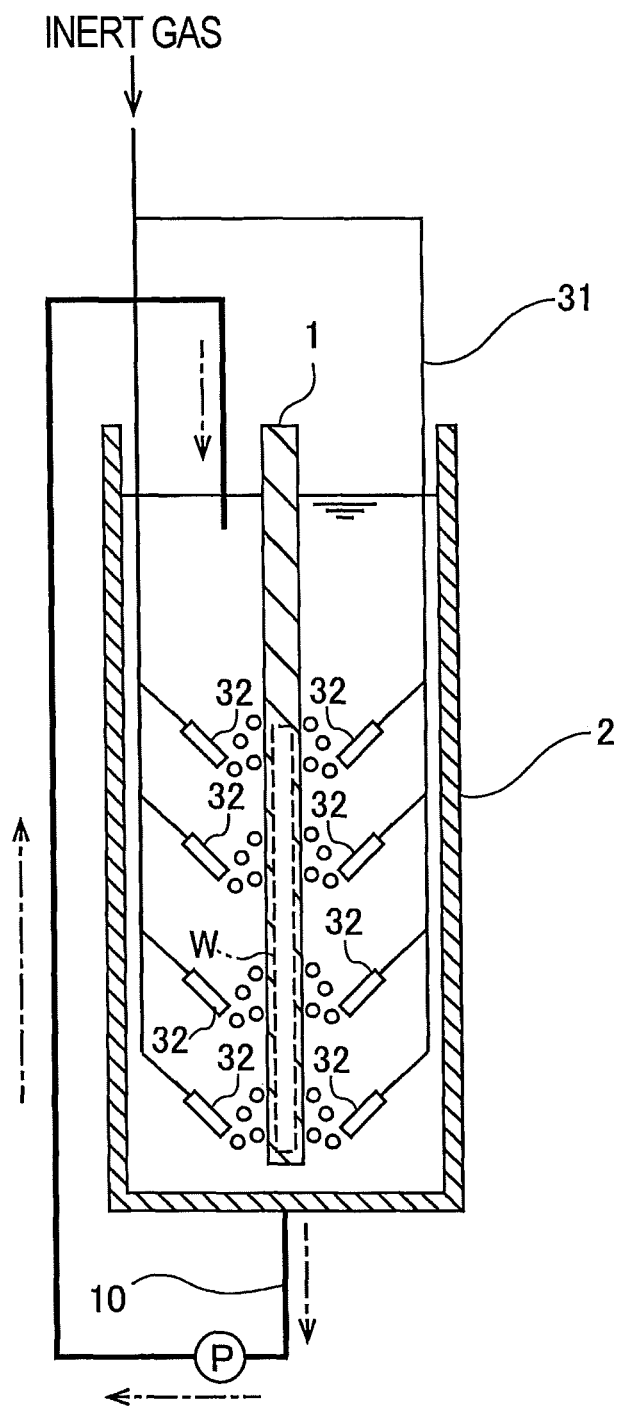
FIG. 12 is a view showing the etching apparatus according to yet another embodiment.

FIG. 12 is a view showing the etching apparatus according to yet another embodiment. Structures of this embodiment, which are the same as those of the embodiment shown in FIG. 7, will not be described particularly, and their duplicate descriptions are omitted. As shown in FIG. 12, the etching apparatus includes a plurality of inert-gas supply nozzles 32 disposed in the etching chamber 2. These inert-gas supply nozzles 32 are coupled to an inert gas supply pipe 31. In this embodiment, eight inert-gas supply nozzles 32 are disposed. However, the number of inert-gas supply nozzles 32 is not limited to this embodiment.

Each of the inert-gas supply nozzles 32 is adjacent to the substrate W placed in the etching chamber 2, and is oriented to the substrate W. When an inert gas is injected from the inert-gas supply nozzles 32 into the etching liquid in the etching chamber 2, the inert gas forms bubbles in the etching liquid. These bubbles uniformly agitate the etching liquid. Therefore, the etching liquid is uniformly brought into contact with the resist of the substrate W, and can uniformly remove the resist. A nitrogen gas may be used as the inert gas.

Figure 13:
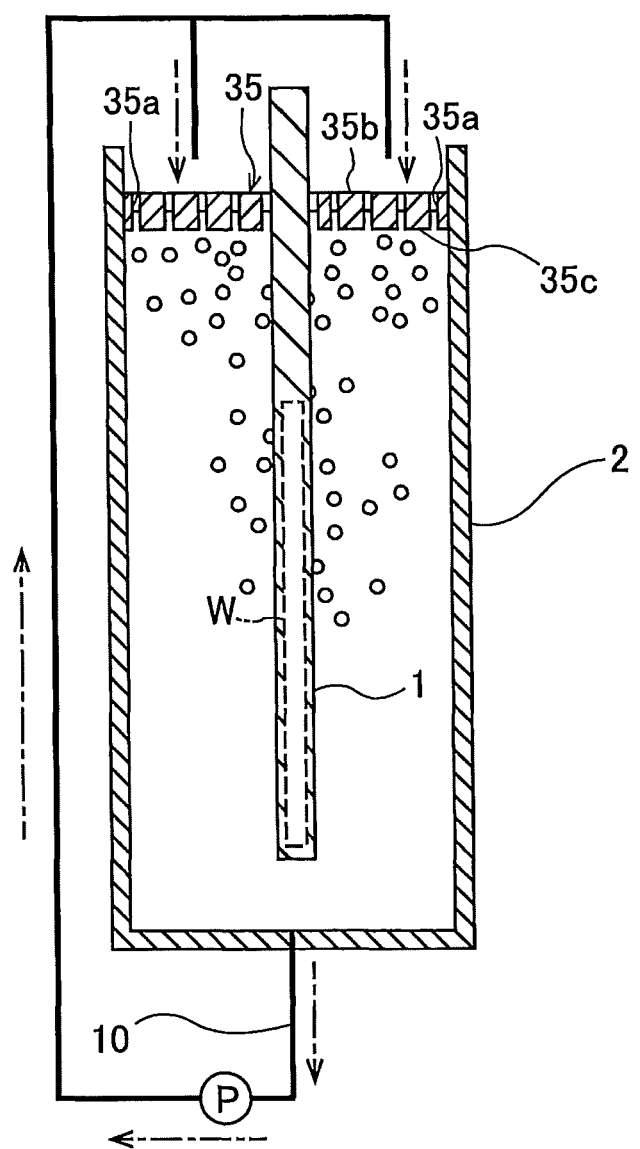
FIG. 13 is a view showing the etching apparatus according to yet another embodiment.

FIG. 13 is a view showing the etching apparatus according to yet another embodiment. Structures of this embodiment, which are the same as those of the embodiment shown in FIG. 7, will not be described particularly, and their duplicate descriptions are omitted. As shown in FIG. 13, the etching apparatus includes a porous member 35 having a plurality of fine through-holes 35a. The porous member 35 is secured to the upper portion of the etching chamber 2. A total amount of the etching liquid is adjusted such that the surface of the etching liquid is located between an upper surface 35b and a lower surface 35c of the porous member 35. One end of the liquid delivery pipe 10 is coupled to the bottom of the etching chamber 2, and other end of the liquid delivery pipe 10 is disposed above the porous member 35.

The etching liquid is supplied onto the porous member 35 through the liquid delivery pipe 10 by the operation of the pump P. The etching liquid is supplied through the through-holes 35a of the porous member 35 into the etching chamber 2. When the etching liquid passes through the through-holes 35a of the porous member 35, an air existing above the porous member 35 is involved in the etching liquid. As a result, the air is uniformly supplied into the etching liquid in the etching chamber 2. The air forms fine bubbles in the etching liquid to agitate the etching liquid.

Figure 14:
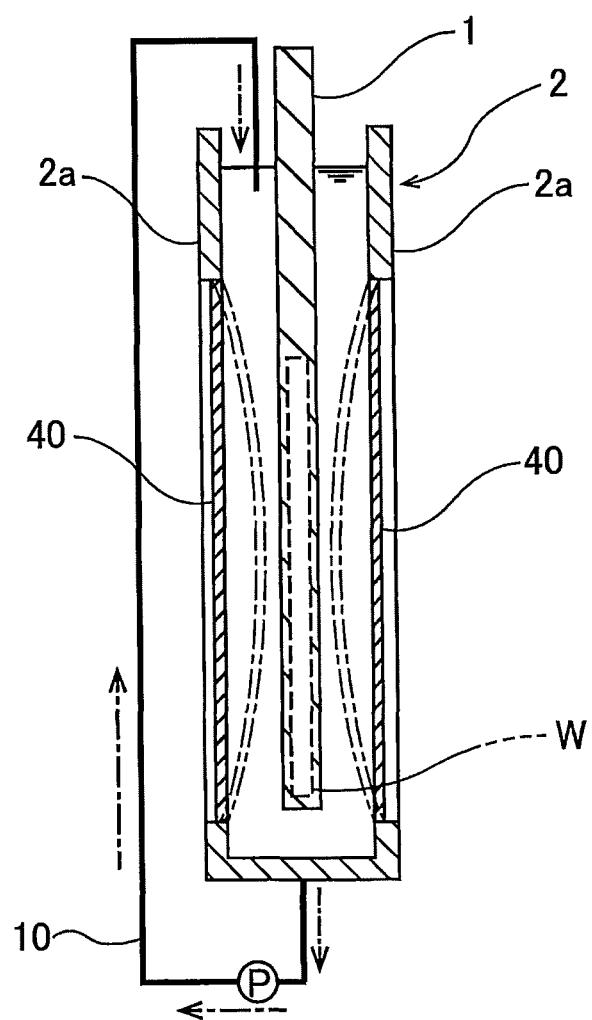
FIG. 14 is a view showing the etching apparatus according to yet another embodiment.

FIG. 14 is a view showing the etching apparatus according to yet another embodiment. Structures of this embodiment, which are the same as those of the embodiment shown in FIG. 7, will not be described particularly, and their duplicate descriptions are omitted. As shown in FIG. 14, the etching apparatus includes elastic membranes 40, 40 which are incorporated in both side walls 2a, 2a of the etching chamber 2, respectively. Each elastic membrane 40 serves as a part of the side wall 2a, and faces the surface of the substrate W held by the substrate holder 1. The elastic membranes 40, 40 are formed from a flexible material, which may be a resin material, such as PTFE (polytetrafluoroethylene) or silicone rubber.

When the etching liquid in the etching chamber 2 is sucked by the operation of the pump P, a pressure of the etching liquid in the etching chamber 2 is lowered. As a result, as shown by imaginary lines (dot-and-dash lines) in FIG. 14, the elastic membranes 40, 40 deform toward the surface of the substrate W, thereby reducing a cross section of the etching chamber 2. Therefore, the flow velocity of the etching liquid descending in the etching chamber 2 is increased, and the etching liquid is brought into contact with the substrate W while forming the turbulent flow.

Figure 15:
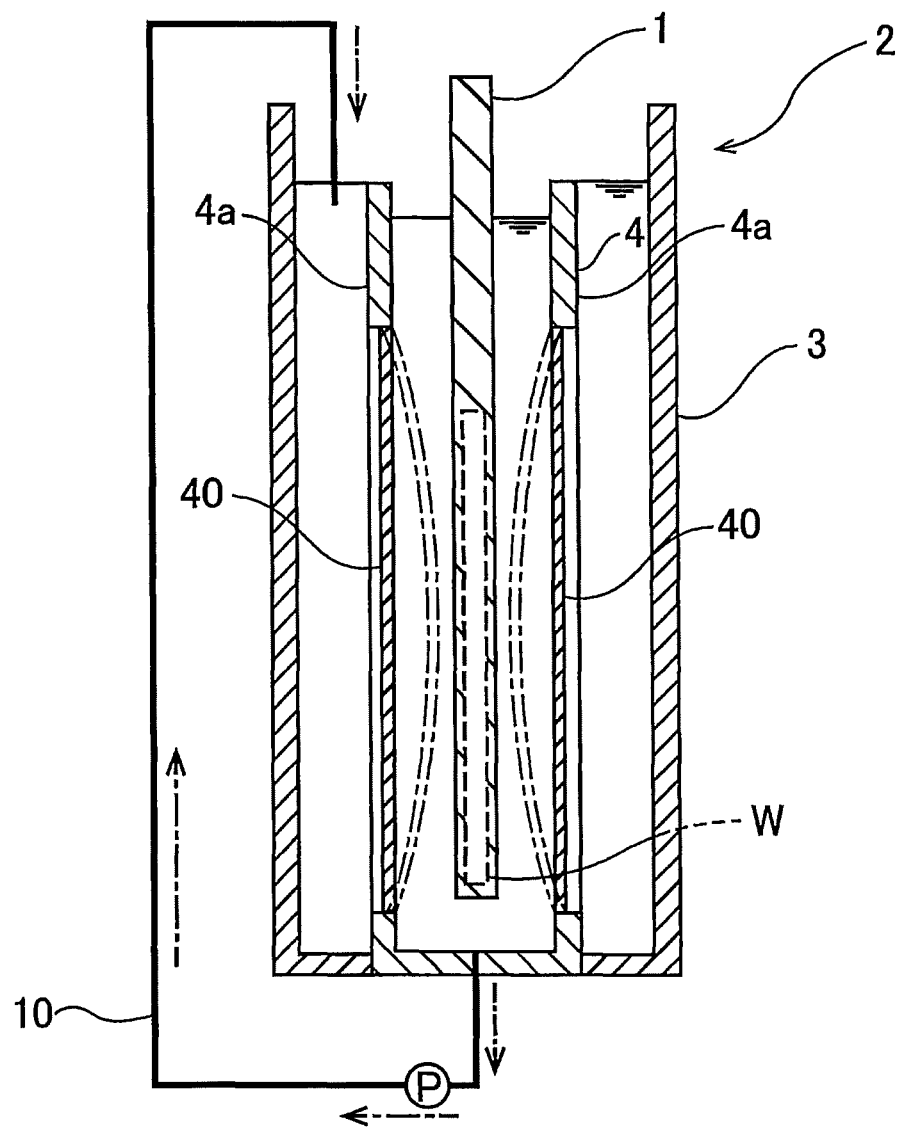
FIG. 15 is a view showing a structural example in which elastic membranes are provided on an inner chamber of an etching chamber.

FIG. 15 is a view showing a structural example in which the elastic membranes 40, 40 are disposed on the inner chamber 4 of the etching chamber 2. In this embodiment, the etching chamber 2 includes the inner chamber 4 and the outer chamber 3. The liquid delivery pipe 10 extends from the bottom of the inner chamber 4 to a position below the surface of the etching liquid in the outer chamber 3. The elastic membranes 40, 40 are incorporated in both side walls 4a, 4a of the inner chamber 4, respectively. Each elastic membrane 40 serves as a part of the side wall 4a, and faces the surface of the substrate W held by the substrate holder 1. One side of each elastic membrane 40 is in contact with the etching liquid in the inner chamber 4, while other side of the elastic membrane 40 is in contact with the etching liquid in the outer chamber 3.

The surface of the etching liquid in the outer chamber 3 lies at a position higher than the surface of the etching liquid in the inner chamber 4. When the etching liquid in the inner chamber 4 flows through the liquid delivery pipe 10 into the outer chamber 3 by the operation of the pump P, the etching liquid in the outer chamber 3 overflows the side walls 4a, 4a of the inner chamber 4 into the inner chamber 4. Since the pressure of the etching liquid in the outer chamber 3 is higher than the pressure of the etching liquid in the inner chamber 4, the elastic membranes 40, 40 deform toward the substrate W, thereby reducing the cross section of the inner chamber 4. Therefore, the flow velocity of the etching liquid descending in the inner chamber 4 is increased, and the etching liquid is brought into contact with the substrate W while forming the turbulent flow.

Figure 16:
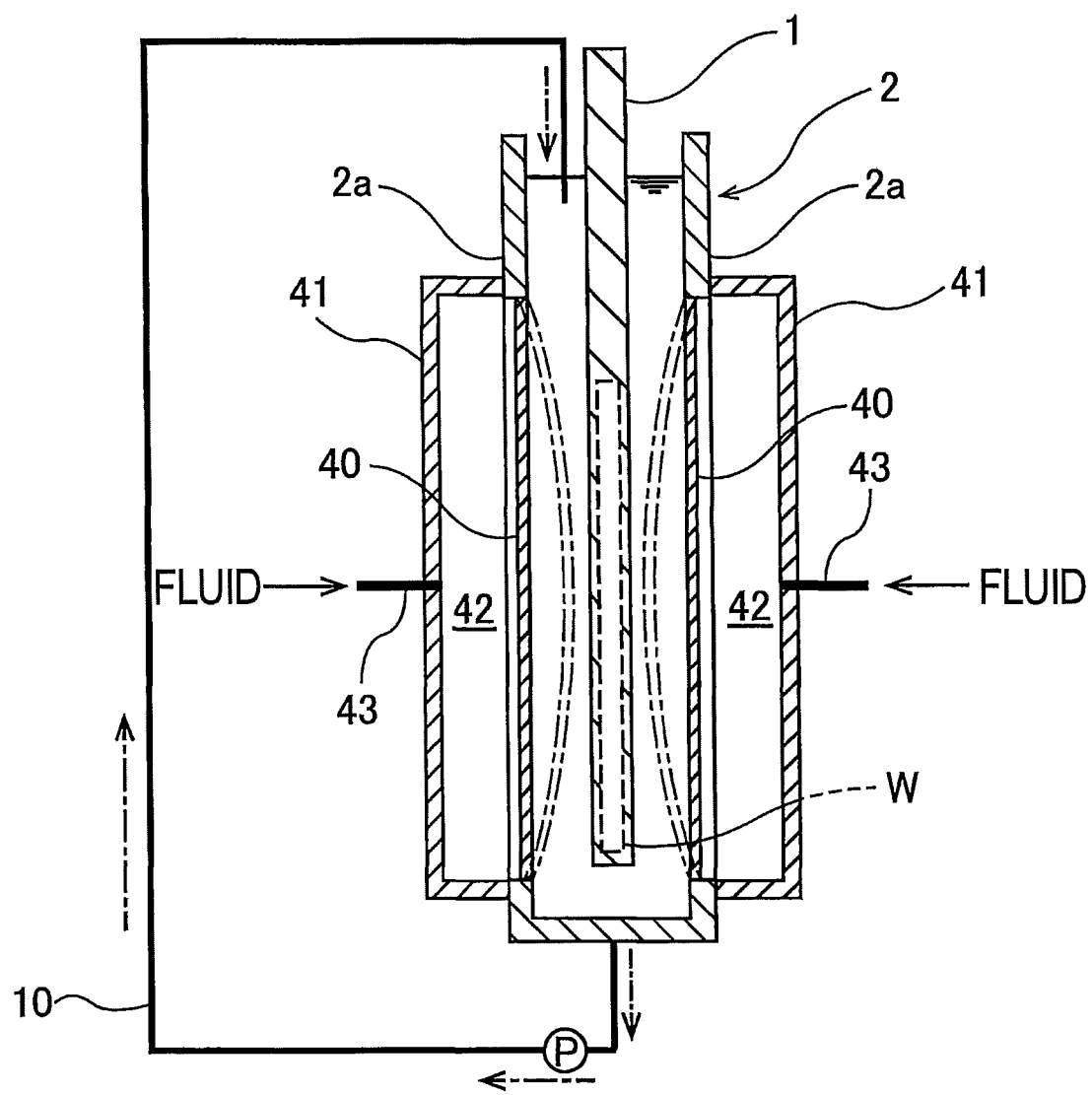
FIG. 16 is a view showing the etching apparatus according to yet another embodiment.
Figure 17:
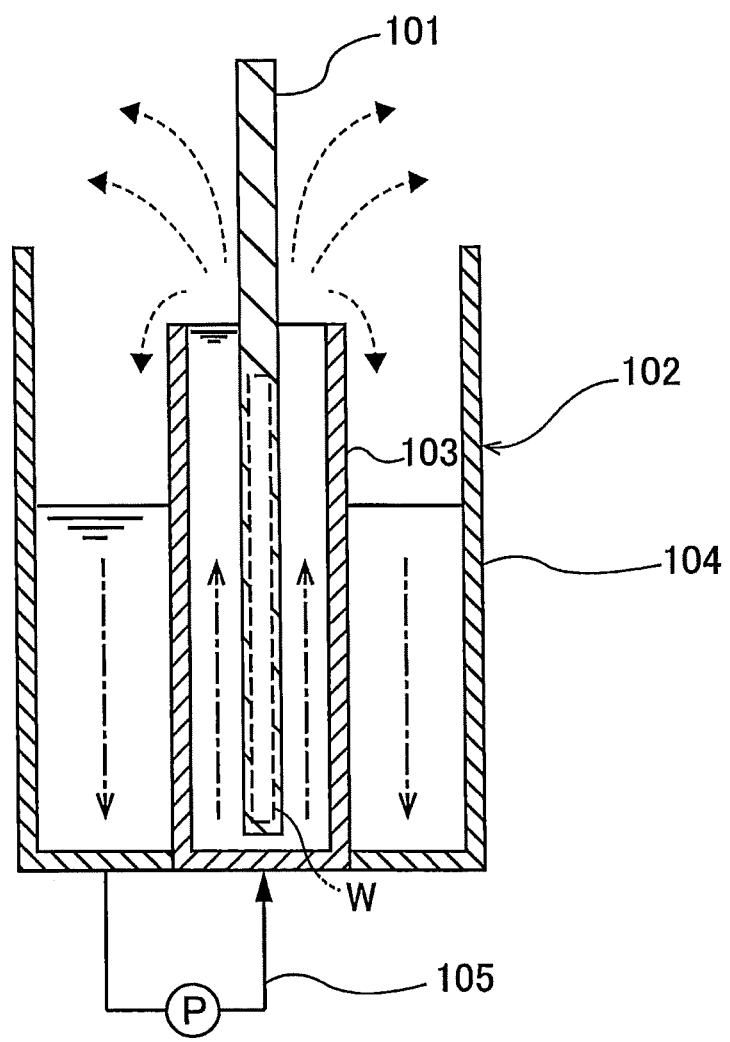
FIG. 17 is a view showing a conventional substrate processing apparatus.

FIG. 16 is a view showing the etching apparatus according to yet another embodiment. Structures of this embodiment, which are the same as those of the embodiment shown in FIG. 14, will not be described particularly, and their duplicate descriptions are omitted. As shown in FIG. 16, boxes 41, 41 are secured to the both side walls 2a, 2a of the etching chamber 2, respectively. A fluid chamber 42 is defined in each box 41. The box 41 is disposed so as to cover an outer surface of the elastic membrane 40, and a part of the fluid chamber 42 is constituted by the elastic membrane 40. Fluid ports 43, 43 are coupled to the boxes 41, 41, respectively. The fluid ports 43, 43 communicate with the fluid chambers 42, 42, respectively. The entireties of the fluid chambers 42, 42 may be formed from the elastic membranes 40, 40, respectively, without providing the boxes 41, 41.

When a fluid, such as pressurized gas, is introduced into the fluid chambers 42, 42 through the fluid ports 43, 43, pressures in the fluid chambers 42, 42 are increased. As a result, the elastic membranes 40, 40 deform toward the substrate W, thereby reducing the cross section of the etching chamber 2. Therefore, the flow velocity of the etching liquid descending in the etching chamber 2 is increased, and the etching liquid is brought into contact with the substrate W while forming the turbulent flow. The fluid that has been supplied into the fluid chambers 42, 42 may be drained through the fluid ports 43, 43.

In the embodiment shown in FIG. 16, the fluid that has been introduced into the fluid chamber 42 causes the elastic membrane 40 to deform toward the substrate W. In one embodiment, an actuator, such as an air cylinder, may be used to deform the elastic membrane 40.

The embodiment shown in FIG. 1 can be combined with the above described embodiments. For example, the guide cover 11 and the flange 12 shown in FIG. 1 may be incorporated in the embodiments shown in FIG. 7 and FIG. 12 to FIG. 16.

While the present invention has been described with reference to the embodiments, it should be understood that the present invention is not limited to the particular embodiments described above, and that other modifications may be made within the technical concept of the present invention. The substrate processing apparatus according to the present invention is not limited to the above-described etching apparatus for removing the resist formed on the surface of the substrate, and can be applied to other apparatus using a processing liquid, such as an electroplating apparatus, an electroless plating apparatus, and an electrolytic etching apparatus. According to the present invention, the flow velocity of the processing liquid on the surface of the substrate can be increased. Therefore, a boundary layer on the substrate surface can be made thin, and as a result, a reaction can be accelerated. In addition, the higher flow velocity of the processing liquid can prevent the bubbles from adhering to the substrate.

What is claimed is:

1. A substrate processing apparatus comprising:
   a substrate holder for holding a substrate;
   a processing chamber configured to hold a processing liquid for processing the substrate, the substrate holder being disposed in the processing chamber;
   a porous member secured to an upper portion of the processing chamber, the porous member having an upper surface and a lower surface, the porous member locating a surface of the processing liquid between the upper surface and the lower surface of the porous member;
   a liquid delivery pipe having one end coupled to a bottom of the processing chamber and other end located above the porous member; and
   a pump coupled to the liquid delivery pipe and configured to suck the processing liquid from the bottom of the processing chamber through the liquid delivery pipe and to supply the processing liquid onto the porous member through the liquid delivery pipe,
   wherein the pump supplies the processing liquid onto the porous member until the surface of the processing liquid is located between the upper surface and the lower surface of the porous member.

2. The substrate processing apparatus according to claim 1, wherein the porous member has a hole to pass the substrate holder.

3. The substrate processing apparatus according to claim 1, wherein the other end of the liquid delivery pipe is branched on both sides of the substrate held by the substrate holder.

\* \* \* \* \*